United States Patent
Ohkubo et al.

(10) Patent No.: US 7,239,002 B2
(45) Date of Patent: Jul. 3, 2007

(54) INTEGRATED CIRCUIT DEVICE

(75) Inventors: Hiroaki Ohkubo, Kawasaki (JP); Kuniko Kikuta, Kawasaki (JP); Yasutaka Nakashiba, Kawasaki (JP); Naoyoshi Kawahara, Kawasaki (JP); Hiroshi Murase, Kawasaki (JP); Naoki Oda, Tokyo (JP); Tokuhito Sasaki, Tokyo (JP); Nobukazu Ito, Tokyo (JP)

(73) Assignees: NEC Electronics Corporation, Kawasaki, Kanagawa (JP); NEC Corporation, Tokyo (JP)

( * ) Notice: Subject to any disclaimer, the term of this patent is extended or adjusted under 35 U.S.C. 154(b) by 0 days.

(21) Appl. No.: 11/038,094

(22) Filed: Jan. 21, 2005

(65) Prior Publication Data

US 2005/0161822 A1     Jul. 28, 2005

(30) Foreign Application Priority Data

Jan. 23, 2004   (JP)   ............................. 2004-016263

(51) Int. Cl.
*H01L 23/58* (2006.01)
*H01L 27/06* (2006.01)
*H01L 23/48* (2006.01)
*G01K 1/14* (2006.01)

(52) U.S. Cl. ......... 257/467; 257/E23.08; 257/E23.142; 257/E27.016; 257/E27.104; 257/E27.081; 257/536; 257/537; 257/774; 257/470; 257/664; 257/662; 257/751; 257/700; 257/758

(58) Field of Classification Search ........ 257/E27.008, 257/E23.08, E23.142, E27.016, E27.104, 257/E27.081, 467, 536, 537, 662, 664, 758, 257/700–702, 751, 4, 1, 773–776
See application file for complete search history.

(56) References Cited

U.S. PATENT DOCUMENTS

| | | | | |
|---|---|---|---|---|
| 4,900,695 A | * | 2/1990 | Takahashi et al. | 438/625 |
| 5,602,043 A | * | 2/1997 | Beratan et al. | 438/54 |
| 6,013,934 A | * | 1/2000 | Embree et al. | 257/467 |
| 6,031,729 A | * | 2/2000 | Berkely et al. | 361/771 |

(Continued)

FOREIGN PATENT DOCUMENTS

JP         1-302849         12/1989

(Continued)

OTHER PUBLICATIONS

Sidhwa, Ardy et al.; Impact of Residual By-Products from Tungsten Film Deposition on Process Integration Due to Nonuniformity of the Tungsten Film; May/Jun. 2002 Journal of Vacuum Science Technology; p. 934.*

*Primary Examiner*—Alexander Oscar Williams
(74) *Attorney, Agent, or Firm*—McGinn IP Law Group, PLLC

(57) ABSTRACT

In a temperature sensor section of a semiconductor integrated circuit device, first vias of tungsten are formed at the topmost layer of a multi-layer wiring layer and pads of titanium are provided on regions of the multi-layer wiring layer which covers the vias. An insulating layer is provided in such a way as to cover the multi-layer wiring layer and the pads, second vias are so formed as to reach the pads. Vanadium oxide is buried in the second vias by reactive sputtering, and a temperature monitor part of vanadium oxide is provided in such a way as to connect the second vias each other. Accordingly, the temperature monitor part is connected between the two wires.

20 Claims, 5 Drawing Sheets

U.S. PATENT DOCUMENTS

| | | | |
|---|---|---|---|
| 6,121,852 A * | 9/2000 | Mizoguchi et al. | 333/35 |
| 6,255,151 B1 * | 7/2001 | Fukuda et al. | 438/197 |
| 6,441,420 B1 * | 8/2002 | Nagano et al. | 257/296 |
| 6,624,384 B2 * | 9/2003 | Tsuchiya et al. | 219/121.69 |
| 6,633,656 B1 * | 10/2003 | Picard | 382/124 |
| 6,723,594 B2 * | 4/2004 | Rhodes | 438/200 |
| 6,764,914 B2 * | 7/2004 | See et al. | 438/393 |
| 6,841,843 B2 * | 1/2005 | Ohkubo et al. | 257/467 |
| 6,890,846 B2 * | 5/2005 | Noguchi | 438/622 |
| 6,956,289 B2 * | 10/2005 | Kunikiyo | 257/758 |
| 2001/0045651 A1 * | 11/2001 | Saito et al. | 257/750 |
| 2005/0173775 A1 * | 8/2005 | Kawahara et al. | 257/467 |
| 2005/0218270 A1 * | 10/2005 | Doverspike | 248/65 |
| 2005/0218471 A1 * | 10/2005 | Ohkubo et al. | 257/467 |
| 2006/0124983 A1 * | 6/2006 | Kutsunai et al. | 257/306 |

FOREIGN PATENT DOCUMENTS

| | | | |
|---|---|---|---|
| JP | 2004-304070 | * | 10/1994 |
| JP | 09-061258 | | 3/1997 |
| JP | 9-229778 | | 9/1997 |
| JP | 10-150153 | | 6/1998 |
| JP | 2000-031414 | | 1/2000 |
| JP | 2002-217258 | | 8/2002 |

* cited by examiner

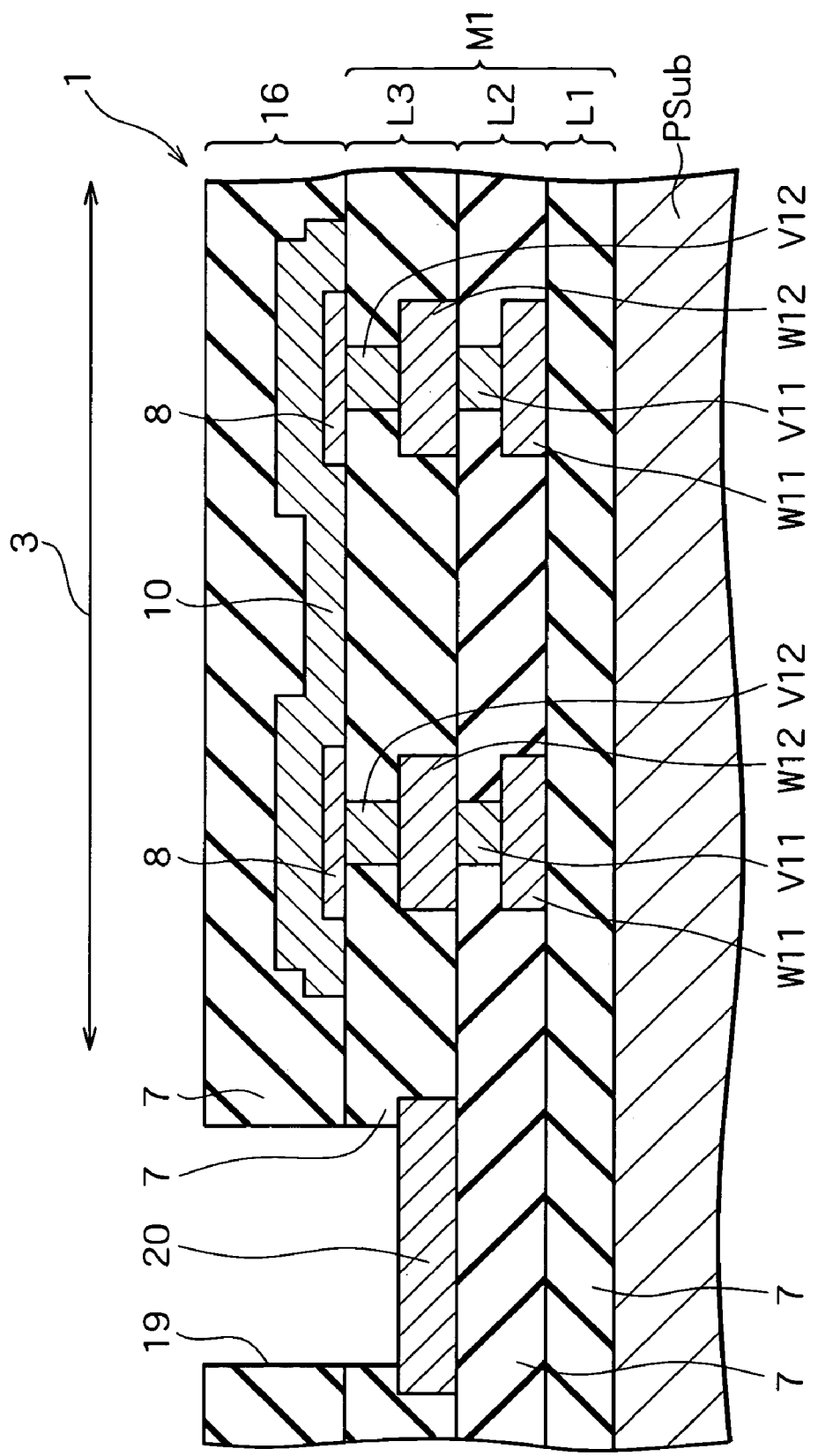

INTEGRATED CIRCUIT DEVICE

BACKGROUND OF THE INVENTION

1. Field of the Invention

The present invention relates to an integrated circuit device with a built-in monolithic temperature sensor. The present invention can be suitably adapted particularly to a semiconductor integrated circuit device having a temperature sensor fabricated in a semiconductor process.

2. Description of the Related Art

Recently, the need for monitoring the operation temperature of an integrated circuit device is growing for the purpose of preventing thermal breakdown of devices in the integrated circuit device and stabilizing the operation of a device having a temperature-dependent characteristic, such as a crystal oscillator, among those devices which are provided in the integrated circuit device.

In this respect, Japanese Patent Laid-Open Publication No. H1-302849, for example, discloses a technique of protecting an LSI (Large Scale Integrated circuit) in a semiconductor integrated-circuit device from thermally broken by a temperature rise by providing a temperature sensor on the same substrate as that of the LSI, deciding that the LSI is abnormally overheated when the temperature detected by the temperature sensor exceeds a predetermined value and then shutting down the LSI.

A technique of using a parasitic pn junction diode as such a temperature sensor is proposed in, for example, Japanese Patent Laid-Open Publication No. H9-229778. FIG. 1 is a cross-sectional view showing a conventional semiconductor integrated circuit device having the temperature sensor described in Japanese Patent Laid-Open Publication No. H9-229778, and FIG. 2 is an equivalent circuit diagram showing the temperature sensor section of the semiconductor integrated circuit device as shown in FIG. 1.

As shown in FIG. 1, this conventional semiconductor integrated circuit device 21 includes a P type silicon substrate PSub and a multi-layer wiring layer M21 formed on the P type silicon substrate PSub. The multi-layer wiring layer M21 is the lamination of plural wiring layers and plural insulating layers alternately laminated. The semiconductor integrated circuit device 21 is provided with a logic circuit section 2, which is formed at the top surface of the P type silicon substrate PSub and a predetermined region of the multi-layer wiring layer M21, and a temperature sensor section 23, which is formed at that region of the top surface of the P type silicon substrate PSub and the multi-layer wiring layer M21 where the logic circuit section 2 is not formed.

A CMOS (Complementary Metal Oxide Semiconductor) circuit 4, for example, is provided in the logic circuit section 2. In the CMOS circuit 4, an N well NW1 and a P well PW1 are formed at the top surface of the P type silicon substrate PSub in such a way as to be adjacent to each other. Two $p^+$ diffusion regions P1 and P2, which becomes a source/drain region, are formed, apart from each other, at the top surface of the N well NW1. Two $n^+$ diffusion regions N1 and N2, which becomes the source/drain region, are formed, apart from each other, at the top surface of the P well PW1. There are a channel region 5 between the $p^+$ diffusion regions P1 and P2 in the N well NW1 and a channel region 6 between the $n^+$ diffusion regions N1 and N2 in the P well PW1.

A gate insulating layer (not shown) is provided at that region in the multi-layer wiring layer M21 which includes regions directly overlying the channel regions 5 and 6, and gate electrodes G1 and G2 of, for example, polysilicon, are respectively provided at the regions directly overlying the channel regions 5 and 6. The gate electrodes G1 and G2 are commonly connected to a gate terminal Vg. The channel region 5, the $p^+$ diffusion regions P1 and P2 as the source/drain region, the gate insulating layer and the gate electrode G1 form a P type MOS transistor. The channel region 6, the $n^+$ diffusion regions N1 and N2 as the source/drain region, the gate insulating layer and the gate electrode G2 form an N-type MOS transistor.

A via V1 is provided on the $p^+$ diffusion region P1 in the multi-layer wiring layer M21 in such a way as to be connected to the $p^+$ diffusion region P1, and a wire W1 is provided on the via V1 in such a way as to be connected to the via V1. A via V2 is provided on the wire W1 in such a way as to be connected to the wire W1, and a power-source potential wire Vcc is provided on the via V2 in such a way as to be connected to the via V2. Accordingly, the $p^+$ diffusion region P1 is connected to the power-source potential wire Vcc through the via V1, the wire W1 and the via V2.

A via V3 is provided on the $p^+$ diffusion region P2 in the multi-layer wiring layer M21 in such a way as to be connected to the $p^+$ diffusion region P2, and a via V4 is provided on the $n^+$ diffusion region N1 in such a way as to be connected to the $n^+$ diffusion region N1. A wire W2 is provided on the vias V3 and V4 in such a way as to be connected to the vias V3 and V4. A via V5 is provided on the wire W2 in such a way as to be connected to the wire W2, and a wire W3 is provided on the via V5 in such a way as to be connected to the via V5. Accordingly, the $p^+$ diffusion region P2 and the $n^+$ diffusion region N1 are connected to the wire W3 through the vias V3 and V4, the wire W2 and the via V5.

Further, a via V6 is provided on the $n^+$ diffusion region N2 in the multi-layer wiring layer M21 in such a way as to be connected to the $n^+$ diffusion region N2, and a wire W4 is provided on the via V6 in such a way as to be connected to the via V6. A via V7 is provided on the wire W4 in such a way as to be connected to the wire W4, and a ground potential wire GND is provided on the via V7 in such a way as to be connected to the via V7. Accordingly, the $n^+$ diffusion region N2 is connected to the ground potential wire GND through the via V6, the wire W4 and the via V7.

A $p^+$ diffusion region P3 is formed at that region of the top surface of the P type silicon substrate PSub which is other than the region where the N well NW1 and the P well PW1 are formed. A via V8, a wire W5, a via V9 and a ground potential wire GND are provided on the $p^+$ diffusion region P3 in the multi-layer wiring layer M21 in order in the bottom-to-top direction, and the $p^+$ diffusion region P3 is connected to the ground potential wire GND through the via V8, the wire W5 and the via V9.

In the temperature sensor section 23, an N well NW2 is formed at the top surface of the P type silicon substrate PSub, and a $p^+$ diffusion region P21 and an $n^+$ diffusion region N21 are formed apart from each other at the top surface of the N well NW2. A via V21, a wire W21, a via V22 and a ground potential wire GND are provided on the $p^+$ diffusion region P21 in the multi-layer wiring layer M21 in order in the bottom-to-top direction, and the $p^+$ diffusion region P21 is connected to the ground potential wire GND through the via V21, the wire W21 and the via V22.

A via V23 is provided on the $n^+$ diffusion region N21 in the multi-layer wiring layer M21 in such a way as to be connected to the $n^+$ diffusion region N21, and a wire W22 is provided on the via V23. The wire W22 is connected to the via V23 at one end, and is connected to an output terminal Vout 21. A via V24 is provided under the wire W22 in such a way as to be connected to the other end of the wire W22, and a resistor R of, for example, polysilicon is provided under the via V24. The resistor R has a sheet shape whose one end is connected to the via V24. The resistor R is formed at the same time as the gate electrodes G1 and G2 of the CMOS circuit 4 and is provided at the same level as the gate electrodes G1 and G2. A via V25 is provided on the resistor R in such a way as to be connected to the other end of the resistor R. A wire W23, a via V26 and a power-source potential wire Vcc are provided on the via V25 in order in the bottom-to-top direction, and the resistor R is connected to the power-source potential wire Vcc through the via V25, the wire W23 and the via V26.

Accordingly, a potential higher than the potential to be applied to the $p^+$ diffusion region P21 is applied to the N well NW2. Consequently, forward pn junction is formed between the $p^+$ diffusion region P21 and the N well NW2, thereby forming a parasitic pn junction diode D.

In the multi-layer wiring layer M21, the vias V1, V3, V4, V6, V8, V21 and V23 are provided in a first insulating layer in which the gate electrodes G1 and G2 and the resistor R are provided in the same level. The wires W1, W2, W4, W5, W21, W22 and W23 are provided in the same level in a first wiring layer provided on the first insulating level, and the vias V2, V5, V7, V9, V22 and V26 are provided in a second insulating layer provided on the first wiring layer. Further, the individual ground potential wires GND, the individual power-source potential wires Vcc, and the wire W3 are provided in the same level in a second wiring layer provided on the second insulating layer. Those portions of the multi-layer wiring layer M21 which exclude the individual vias, the individual wires and the resistor R, and the layer overlying the second wiring layer are buried with an insulation material 7.

In the temperature sensor section 23 of the semiconductor integrated circuit device 21, as shown in FIG. 2, the resistor R and the parasitic pn junction diode D are connected in series in this order from the power-source potential wire Vcc toward the ground potential wire GND, and the output terminal Vout 21 is connected to the node between the resistor R and the parasitic pn junction diode D. The parasitic pn junction diode D is connected in the forward direction.

With the structure, as shown in FIG. 1, when the temperature of the semiconductor integrated circuit device 21 changes, the characteristic of the parasitic pn junction diode D changes, which changes the potential of the output terminal Vout 21. The temperature of the semiconductor integrated circuit device 21 can be measured by detecting the potential of the output terminal Vout 21. Because the parasitic pn junction diode D can be formed in the semiconductor integrated circuit device 21 by using the device structure of an MOS transistor, the temperature sensor section 23 can be formed without changing the conventional MOS process.

The prior art however has the following problem. According to the prior art shown in FIGS. 1 and 2, as the temperature coefficient of the parasitic pn junction diode D is as low as 0.002/K or so, a sufficient SNR (Signal-to-Noise Ratio) cannot be acquired.

SUMMARY OF THE INVENTION

Accordingly, it is an object of the present invention to provide a integrated circuit device having a temperature sensor capable of providing a sufficient SNR.

A integrated circuit device according to the invention comprises a substrate, and a multi-layer wiring layer provided on the substrate. The multi-layer wiring layer has two wires, two plugs respectively connected to the two wires, a temperature monitor part made of a metal oxide and connected between the two plugs, and two pads which are respectively connected between the plugs and the temperature monitor part. Each pad is formed of a material that does not form an insulator film between that pad and the metal oxide.

According to the invention, the temperature monitor part is connected between the wires through the plugs and the pads. As the resistivity of the metal oxide forming the temperature monitor part changes according to the temperature, the temperature can be measured by measuring the resistance between the wires. As the temperature coefficient of the resistivity of the metal oxide is higher and more stable than the temperature coefficient of the resistivity of the pn junction diode, temperature measurement with a high SNR can be achieved. Because the pads of the aforementioned conductive material are provided between the plugs and the temperature monitor part in the present invention, an insulator film is not formed at the interfaces between the plugs and the temperature monitor part when the temperature monitor part is formed, thus ensuring a high connection reliability between the plugs and the temperature monitor part.

The metal oxide may be a vanadium oxide ($VO_x$), and the plugs may be formed of tungsten (W). The pads may be formed of one type of a conductive material selected from a group of Ti, TiN, Al, AlCu alloy, Cu, Ta, TaN and NiCr alloy, or a compound of at least two types of conductive materials selected from the group, or a material containing those conductive materials or the compound. When the temperature monitor part of a vanadium oxide is directly formed on the plugs made of tungsten, an insulator film may be formed at the interfaces between the plugs and the temperature monitor part when the temperature monitor part may be formed, lowering the connection reliability. Such formation of an insulator film can be prevented by providing the pads of the aforementioned material between the plugs and the temperature monitor part.

It is preferable that the integrated circuit device should further include a logic circuit section at least a part of which is laid out directly under the temperature monitor part. This can ensure effective use of a region directly under the temperature monitor part, and thus saves the space required, making it possible to miniaturize an integrated circuit device.

It is preferable that the wires should be wires at a topmost layer of the multi-layer wiring layer, and the plugs, the pads and the temperature monitor part should be laid above the wires. Accordingly, the conventional platform can be used for those portions in the semiconductor integrated circuit device which underlie the wires of the topmost layer of the multi-layer wiring layer. Even when the temperature monitor part is formed of a special material, the manufacture equipment which fabricates the portions lying under the wires of the topmost layer will not be contaminated.

According to the present invention, the provision of the temperature monitor part of a metal oxide can realize an integrated circuit device with a high-SNR temperature sensor.

BRIEF DESCRIPTION OF THE DRAWINGS

FIG. 5 is a cross-sectional view showing a semiconductor integrated circuit device according to a second embodiment of the present invention.

DETAILED DESCRIPTION OF THE PREFERRED EMBODIMENTS

Figure 3:
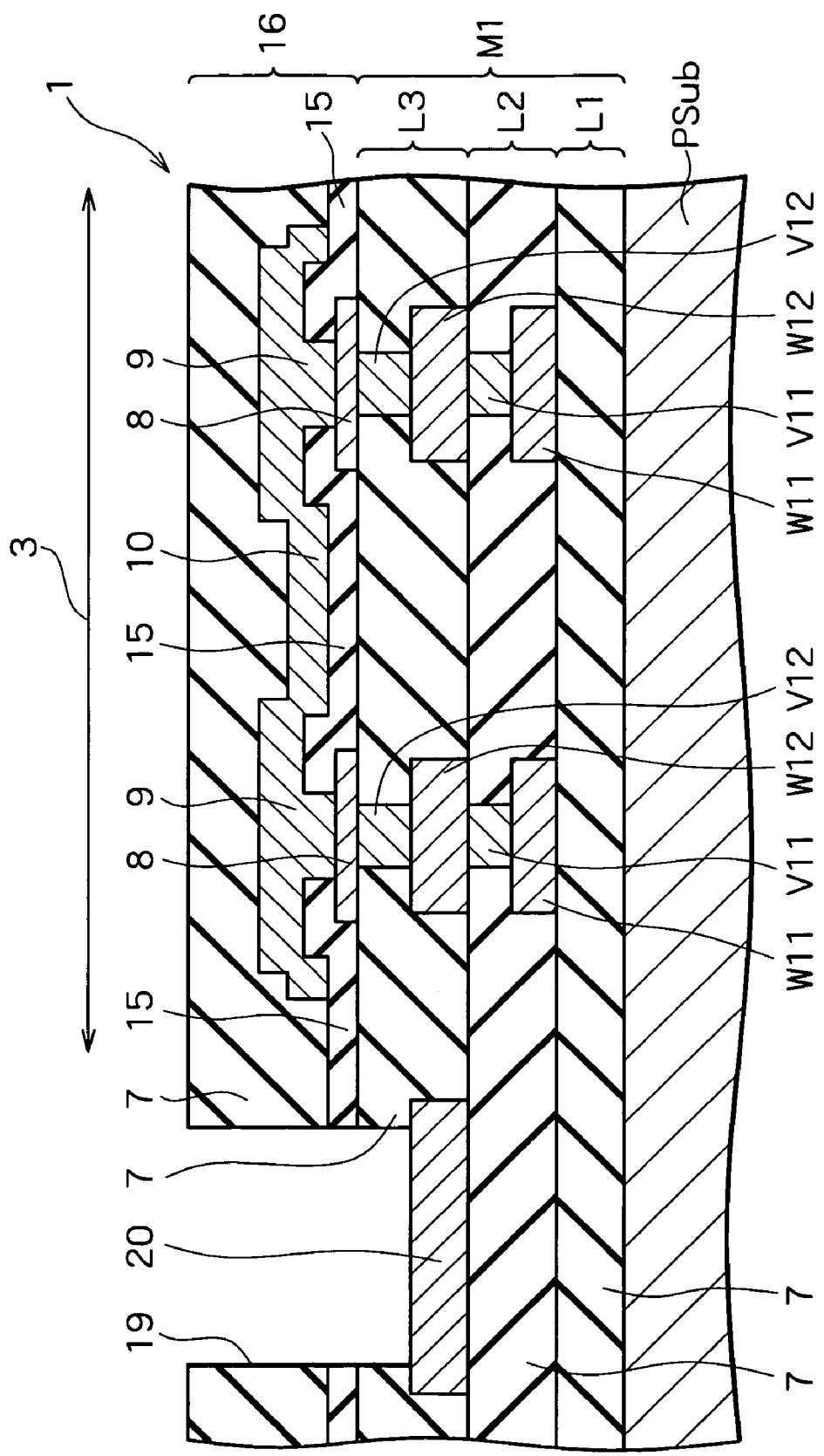
FIG. 3 is a cross-sectional view showing a semiconductor integrated circuit device according to a first embodiment of the present invention.
Figure 4:
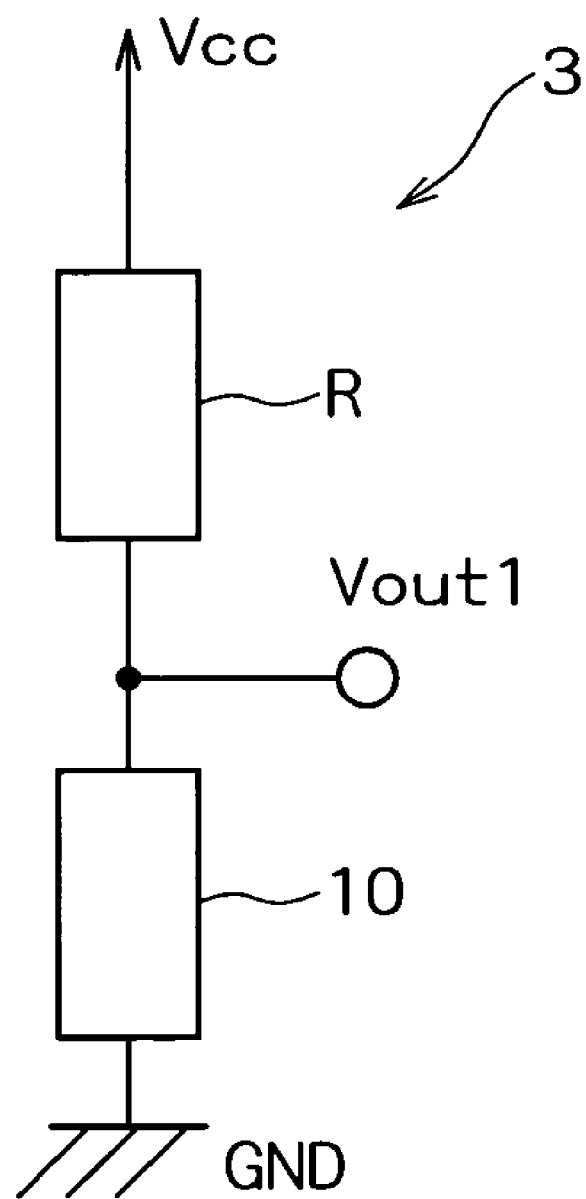
FIG. 4 is an equivalent circuit diagram showing the temperature sensor section of the semiconductor integrated circuit device shown in FIG. 3.

Preferred embodiments of the present invention will be described specifically below with reference to the accompanying drawings. To begin with, a first embodiment of the present invention will be discussed. FIG. 3 is a cross-sectional view showing a semiconductor integrated circuit device according to the first embodiment of the invention, and FIG. 4 is an equivalent circuit diagram showing the temperature sensor section of the semiconductor integrated circuit device shown in FIG. 3. The semiconductor integrated circuit device according to the present embodiment is formed on a single silicon chip. As shown in FIG. 3, the semiconductor integrated circuit device 1 according to the embodiment is provided with a temperature sensor section 3, a logic circuit section (not shown) and an external pad to connect the internal circuit of the semiconductor integrated circuit device 1 to an external device. The following will describe the structure that is common to the entire semiconductor integrated circuit device 1.

The semiconductor integrated circuit device 1 is provided with a P type silicon substrate PSub on which a multi-layer wiring layer M1 is provided. A sheet layer 16 is provided on the multi-layer wiring layer M1. The multi-layer wiring layer M1 is the lamination of, for example, three wiring layers L1 to L3 laminated in order from the substrate side. A wire W11 of, for example, aluminum (Al) is provided at the wiring layer L2, and a via V11 of, for example, tungsten (W) is provided as a plug on the wire W11. A wire W12 of, for example, Al is provided at the wiring layer L3, and a via V12 of, for example, W is provided as a plug on the wire W12. The wire W12 is the topmost wire of the multi-layer wiring layer M1. The wire W11, the via V11, the wire W12 and the via V12 are connected in series in the named order. Provided at the wiring layer L1 is a via (not shown) which connects the wire W11 to a diffusion region (not shown) formed at the top surface of the P type silicon substrate PSub. A normal wire is not formed in the sheet layer 16, unlike in the wiring layer in the multi-layer wiring layer M1. Further, those portions of the multi-layer wiring layer M1 and the sheet layer 16 which exclude the wires and the vias are buried with an insulation material 7, such as a silicon oxide.

The structures of the individual sections of the semiconductor integrated circuit device 1 will be described now. The structure of the logic circuit section of the semiconductor integrated circuit device 1 is the same as the structure of the logic circuit section 2 of the semiconductor integrated circuit device 21. That is, the logic circuit section performs processes, such as arithmetic operations and storage, and has devices such as a CMOS circuit. The logic circuit section may include a circuit which performs data processing on the results of measurements done by a temperature sensor section 3.

In the temperature sensor section 3, as mentioned above, the two wires W11 and the two wires W12 are provided at the wiring layers L2 and L3 of the multi-layer wiring layer M1, respectively, and the via V11 and the via V12 are provided on the wires W11 and W12. Accordingly, two sets of conductive structures each having the wire W11, the via V11, the wire W12 and the via V12 connected in series in the named order are provided in the multi-layer wiring layer M1. Two pads 8 of, for example, titanium (Ti) are provided at that regions in the multi-layer wiring layer M1 which covers the top side of the vias V12. The thickness of the pad 8 is, for example, 100 to 200 nm. The pad takes such a shape as to cover the via V12 as seen from the direction perpendicular to the top surface of the multi-layer wiring layer M1 (hereinafter called "in a planar view").

An insulating layer 15 is provided in such a way as to cover the multi-layer wiring layer M1 and the pads 8, and two vias 9 are formed at that regions of the insulating layer 15 which lies directly above the pads 8 in such a way as to reach the pads 8. That is, the insulating layer 15 covers that region of the top surface of the multi-layer wiring layer M1 which is not covered with the pads 8 and the peripheral portion of the pads 8, not the center portion of the pad 8.

An vanadium oxide ($VO_x$) is buried in the via 9. A temperature monitor part 10 of an vanadium oxide is provided in such a way as to connect two vias 9. The vanadium oxide buried in the via 9 and the vanadium oxide which forms the temperature monitor part 10 are formed by successively depositing a target of vanadium by reactive sputtering under the oxygen atmosphere. Therefore, there is no substantial interface between the via 9 and the temperature monitor part 10, which are integrated. An insulating layer made of the insulation material 7 is formed on the insulating layer 15 in such a way as to cover the temperature monitor part 10. The pad 8, the insulating layer 15, the temperature monitor part 10 and the insulating layer of the insulation material 7 form the sheet layer 16.

The shape of the temperature monitor part 10 is, for example, a square sheet in a planar view, and one side of the square is, for example, 10 to 20 μm, with a thickness of, for example, 0.1 to 0.2 μm. Stable compound of a vanadium oxide are, for example, $VO_2$ and $V_2O_5$ or so, and x in the chemical formula, $VO_x$, for the vanadium oxide is around "2". The volume resistivity of the vanadium oxide when the temperature is 25° C. is, for example, 0.01 to 10 (Ω·cm) or so on the silicon wafer, and the temperature coefficient is about −0.02 to −0.03 (/K). The resistance of the temperature monitor part 10 is, for example, several hundred Ω, e.g., 300 Ω.

As the temperature sensor section 3 is constructed in the above-described manner, one of the two wires W11 is connected to one end of the temperature monitor part 10 through one via V11, one wire W12, one via V12, one pad 8 and one via 9, while the other one of the two wires W11 is connected to the other end of the temperature monitor part 10 through the other via V11, the other wire W12, the other via V12, the other pad 8 and the other via 9. That is, the temperature monitor part 10 is connected between two wires 11.

Figure 1:
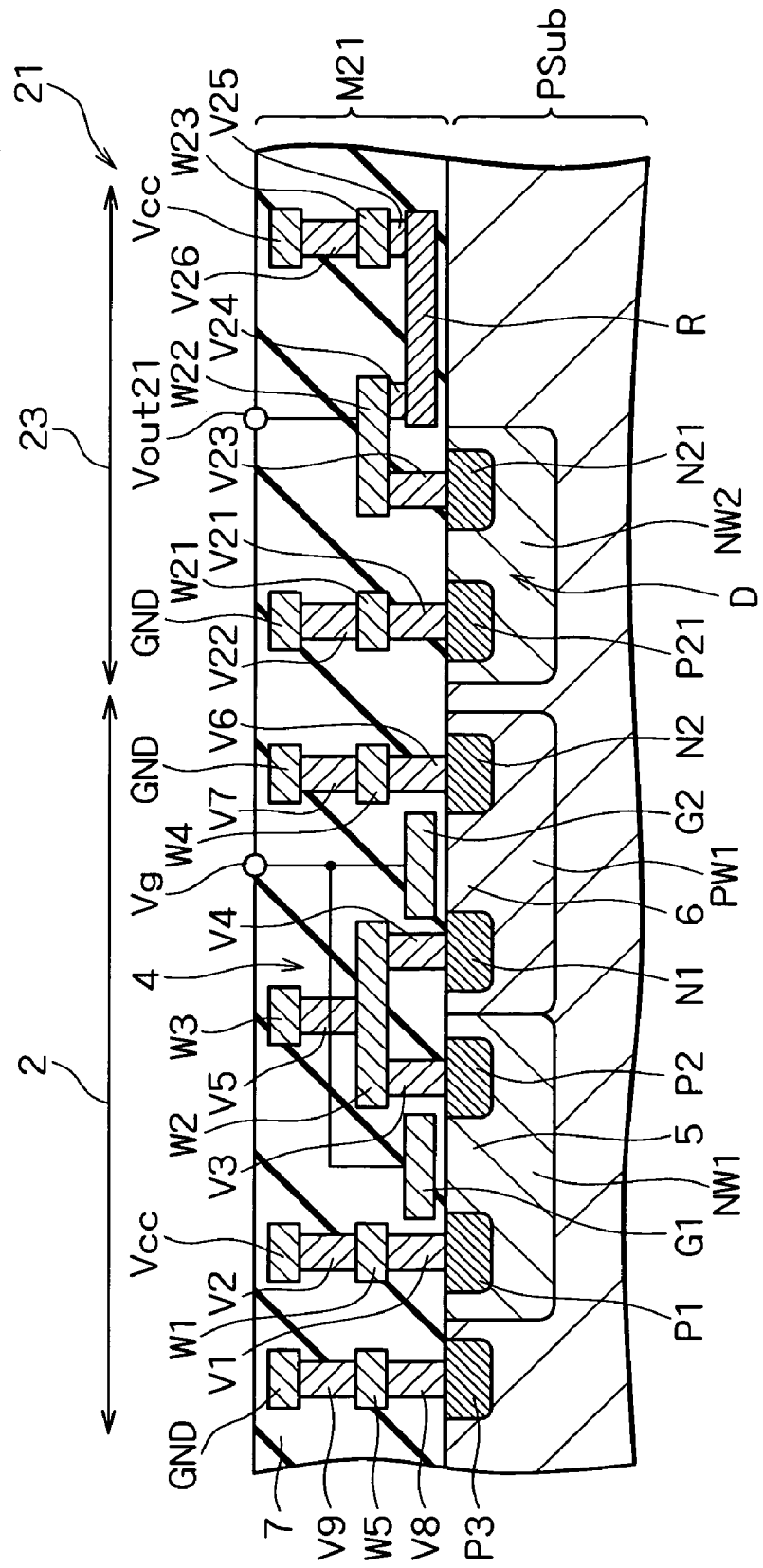
FIG. 1 is a cross-sectional view showing a conventional semiconductor integrated circuit device having the temperature sensor.
Figure 2:
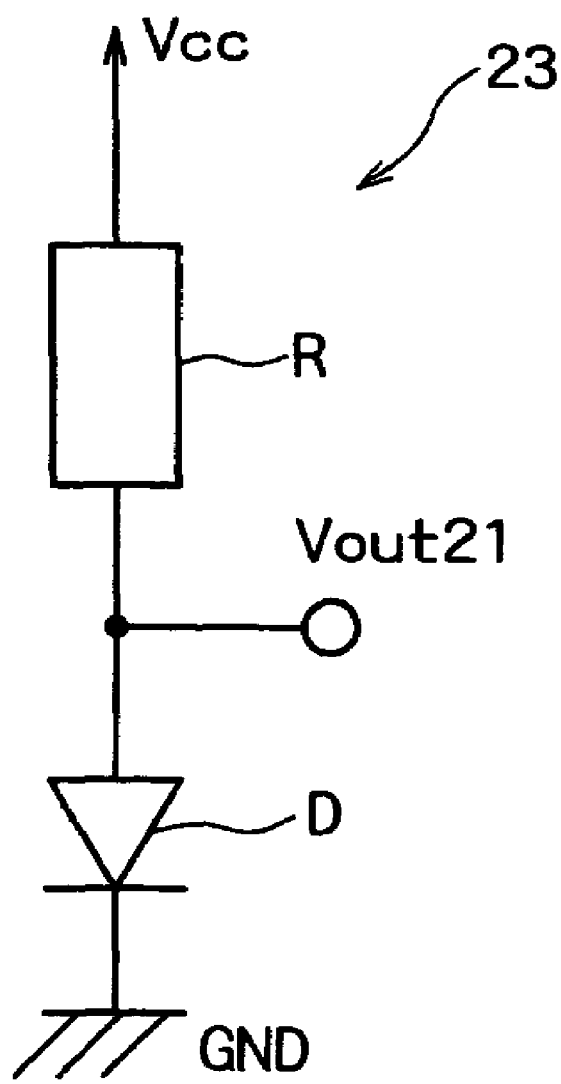
FIG. 2 is an equivalent circuit diagram showing the temperature sensor section of the semiconductor integrated circuit device shown in FIG. 1.

For example, one of the wires W11 is connected to a ground potential wire GND (see FIG. 4), while the other wire W11 is connected to a power-source potential wire Vcc (see FIG. 4) through a resistor R (see FIG. 4) and an output terminal Vout1 (see FIG. 4) is connected between the temperature monitor part 10 and the resistor R. The structure of the resistor R and the layout position in the multi-layer wiring layer M1 are the same as the resistor R of the conventional semiconductor integrated circuit device 21 shown in, for example, FIG. 1. That is, the resistor R in the present embodiment is formed by a polysilicon layer, and its resistance is, for example, set nearly equal to the resistance of the temperature monitor part 10 and is, for example, several hundred Ω, e.g., 300 Ω.

An opening 19 is formed in the wiring layer L3 of the multi-layer wiring layer M1 and the sheet layer 16 at a part of that portion of the semiconductor integrated circuit device 1 which excludes the logic circuit section and the temperature sensor section 3, and an external pad 20 is provided at the bottom of the insulating layer 19. The external pad 20 is formed of, for example, Al, and is provided in the same level as the wire W12. The external pad 20 serves to connect the semiconductor integrated circuit device 1 to an external device.

As the semiconductor integrated circuit device 1 according to the present embodiment is constructed in the above-described manner, a circuit having the resistor R and the temperature monitor part 10 connected in series in the named order from the power-source potential wire Vcc toward the ground potential wire GND is formed in the temperature sensor section 3 as shown in FIG. 4. The output terminal Vout1 is connected to the node between the resistor R and the temperature monitor part 10.

In the semiconductor integrated circuit device 1, the logic circuit section (not shown) is provided at the P type silicon substrate PSub and the multi-layer wiring layer M1, not at the sheet layer 16 which is the upper layer of the multi-layer wiring layer M1. The temperature monitor part 10 of the temperature sensor section 3, however, is provided at the sheet layer 16.

The operation of the semiconductor integrated circuit device 1 according to the present embodiment with the above-described structure will be discussed below. When the ground potential is applied to the ground potential wire GND and the power-source potential is applied to the power-source potential wire Vcc, as shown in FIG. 4, the potential of the output terminal Vout1 takes a value between the ground potential and the power-source potential, which is determined by the resistance of the temperature monitor part 10 and the resistance of the resistor R. When the temperature of the semiconductor integrated circuit device 1 rises due to the rise in the outside temperature or the heat generated by the logic circuit section driven, the temperature of the temperature monitor part 10 rises too, so that its resistance decreases. Because the temperature coefficient of the resistivity of the vanadium oxide forming the temperature monitor part 10 is −0.02 to −0.03 or so at this time, the resistance decreases 2 to 3% or so, as the temperature rises by 1° C. Then, the temperature of the semiconductor integrated circuit device 1 is measured by detecting the potential of the output terminal Vout1.

The effects of the present embodiment will be discussed next. As the absolute value of the temperature coefficient of the resistivity of a vanadium oxide is 0.02 to 0.03 or so, which is greater than the absolute value of the parasitic pn junction diode, 0.002, a high SNR can be acquired at the time of measuring the temperature. As the vanadium oxide is chemically stable, the reliability of the temperature sensor section 3 can be improved. This results in an improvement of the reliability of the semiconductor integrated circuit device 1.

As the pad 8 of Ti is provided between the via V12 of tungsten and the via 9 of a vanadium oxide, no insulator film is formed between the via V12 and the via 9 at the time of depositing the vanadium oxide in the via 9. This can improve the connection reliability between the via V12 and the via 9.

If the pad 8 is not provided and a vanadium oxide is deposited directly on the via V12 of tungsten, an insulator film may be formed between the tungsten and vanadium oxide. This drops the connection reliability between the via V12 and the via 9. While it is assumed that the composition of the insulator film contains a metal compound of tungsten and vanadium, the detailed composition, the layer thickness, etc. are unclear.

Further, the temperature monitor part 10 is provided at the sheet layer 16 which is the upper layer of the multi-layer wiring layer M1 and the logic circuit section is provided not at the sheet layer 16 but at a wiring layer lying below the sheet layer 16 in the present embodiment. This makes it possible to use existing macros for the logic circuit section. Because the temperature monitor part 10 can be formed after the formation of the logic circuit section, the logic circuit section can be formed by the conventional fabrication process. With regard to the logic circuit section, therefore, it is unnecessary to change the existing platform. This can suppress an increase in manufacturing cost which is brought up by the provision of the temperature monitor part 10. In addition, the logic circuit section is not contaminated by the vanadium oxide, and the semiconductor manufacture equipment for fabricating the logic circuit section is not contaminated by the vanadium oxide.

Although the foregoing description of the embodiment describes the pad 8 formed of Ti as an example, the invention is not limited to this mode. The pad 8 has only to be formed of a material which does not form an insulator film between the material for the via V12 and the material for the temperature monitor part 10, and may be formed of one type of a conductive material selected from a group of, for example, Ti, TiN, Al, AlCu alloy, Cu, Ta, TaN and NiCr alloy, or a compound of at least two types of conductive materials selected from the group, or a material containing those conductive materials or the compound.

Although the foregoing description of the present embodiment describes the wires W11 and W12 formed of Al as an example, the invention is not limited to this mode, but the wires W11 and W12 may be formed of, for example, a three-layer film comprised of a TiN layer, an AlCu alloy layer and a TiN layer.

Although the foregoing description of the present embodiment discusses an example in which the temperature sensor section 3 is formed at a region different from the region where the logic circuit section is formed, at least a part of the logic circuit section may be laid out directly under the temperature monitor part in the present invention. This can ensure effective use of the region directly under the temperature monitor part 10, thus saving the space required, which makes it possible to reduce the layout area of the semiconductor integrated circuit device 1 and design the device smaller.

The temperature sensor sections 3 may be formed at one location of a chip where the semiconductor integrated circuit device 1 is formed, or may be formed at plural locations of the chip respectively. For example, the temperature sensor sections 3 may be formed at the center portion and four corners of the chip, i.e., at a total of five locations. As the temperature sensor sections 3 are respectively provided at plural locations and the average value of the measurements of the individual temperature sensor sections 3 is computed, the accuracy of the temperature measurement can be improved further.

A second embodiment of the present invention will be discussed below. FIG. 5 is a cross-sectional view showing a semiconductor integrated circuit device according to the embodiment. As shown in FIG. 5, the second embodiment differs from the first embodiment in that the insulating layer 15 is not provided at the sheet layer 16 of a semiconductor integrated circuit device 11. According to the embodiment, therefore, the temperature monitor part 10 is provided in such a way as to cover the pads 8 provided on the multi-layer wiring layer M1, and is in contact with the pads 8. That is, the temperature monitor part 10 is connected directly to the pads 8 without through the vias or so. The other structure and the operation of the embodiment are the same as those of the first embodiment.

As the second embodiment eliminates the need for the insulating layer 15 as compared with the first embodiment, the fabrication process of the semiconductor integrated circuit device can be simplified. As the temperature monitor part 10 is connected directly to the pads 8, the connection resistance between them can be lowered. The other effects of the embodiment are the same as those of the first embodiment.

What is claimed is:

1. An integrated circuit device, comprising:
    a substrate;
    a multi-layer wiring layer which is provided on said substrate, said multi-layer wiring layer comprising:
        two wires; and
        two plugs respectively connected to said two wires;
    a temperature monitor part comprising a metal oxide and electrically connected between said two plugs, a resistivity of said metal oxide changing in response to a temperature; and
    two pads which are respectively connected between said plugs and said temperature monitor part, and each of which is formed of a material that does not form an insulator film between that pad and said metal oxide.

2. The integrated circuit device according to claim 1, wherein said metal oxide comprises a vanadium oxide.

3. The integrated circuit device according to claim 1, wherein said plugs comprise tungsten.

4. The integrated circuit device according to claim 1, wherein said pads are formed of one type of a conductive material selected from a group of Ti, TiN, Al, AlCu alloy, Cu, Ta, TaN and NiCr alloy, or a compound of at least two types of conductive materials selected from said group, or a material containing those conductive materials or said compound.

5. The integrated circuit device according to claim 1, further comprising:
    an insulating layer provided in such a way as to cover said pads; and
    vias formed at regions of said insulating layer which directly overlies said pads, wherein said metal oxide is buried in said vias and said temperature monitor part is connected to said pads through said metal oxide in said vias.

6. The integrated circuit device according to claim 1, wherein said temperature monitor part is laid out in such a way as to cover said pads and is in contact with said pads.

7. The integrated circuit device according to claim 1, further comprising:
    a logic circuit section at least a part of which is laid out directly under said temperature monitor part.

8. The integrated circuit device according to claim 1, wherein said wires are wires at a topmost layer of said multi-layer wiring layer, and said plugs, said pads and said temperature monitor part are laid above said wires.

9. The integrated circuit device according to claim 8, wherein an opening reaching said wires is formed in that layer which includes said plugs, said pads and said temperature monitor part, at excluding regions directly overlying and directly underlying said temperature monitor part.

10. The integrated circuit device according to claim 1, wherein said temperature monitor part has a shape of a sheet.

11. A semiconductor device comprising:
    an insulating layer;
    a plug formed in said insulating layer;
    a temperature sensor electrically connected to said plug;
    a resistor component electrically connected to said temperature sensor; and
    a pad intervening between said plug and said temperature sensor,
    wherein a current passing through said temperature sensor and said resistor component provides an indication of a local temperature at a location of said temperature sensor in said semiconductor device.

12. The semiconductor device according to claim 11, wherein said pad comprises a material different from said plug and said temperature sensor.

13. The semiconductor device according to claim 11, further comprising:
    an insulating film intervening between said temperature sensor and said pad and having a via hole exposing said pad in a bottom thereof, wherein said temperature sensor is partially embedded in said via hole and elongated over said insulating film.

14. The semiconductor device according to claim 11, wherein said temperature sensor comprises a metal oxide.

15. The semiconductor device according to claim 14, wherein said metal oxide comprises a vanadium oxide.

16. The semiconductor device according to claim 14, wherein said pad comprises a material comprising one or more of Ti, TiN, Al, AlCu alloy, Cu, Ta, TaN, and NiCr alloy.

17. The semiconductor device according to claim 11, wherein said pad prevents an insulating material from being formed between said plug and said temperature sensor.

18. The integrated circuit device according to claim 1, further comprising:
    a resistor serially connected to said temperature monitor part such that a current passing through said resistor and said temperature monitor part via said two wires provides a voltage indicating a local temperature of said integrated circuit device at a location of said temperature monitor part.

19. The integrated circuit device according to claim 1, wherein said plug comprises metal.

20. A semiconductor device, comprising:
    a multi-layer wiring layer, said multi-layer wiring layer comprising:
        an insulating film; and
        a plug formed in said insulating layer;
    a temperature sensor electrically connected to said plug;
    a resistor component electrically connected to said temperature sensor; and
    a pad intervening between said plug and said temperature sensor, said resistor component providing an indication of a local temperature at a location of said temperature sensor in said semiconductor device.

* * * * *